(12) United States Patent
Bannatyne et al.

(10) Patent No.: US 6,496,946 B2
(45) Date of Patent: Dec. 17, 2002

(54) ELECTRONIC CONTROL APPARATUS WITH MEMORY VALIDATION AND METHOD

(75) Inventors: Ross Bannatyne, Austin, TX (US); Clay E. Merritt, Noblesville, IN (US); Nancy L. Thomas, Dripping Springs, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/309,383

(22) Filed: May 10, 1999

(65) Prior Publication Data

US 2002/0056056 A1 May 9, 2002

(51) Int. Cl.[7] .................................................. H02H 3/05
(52) U.S. Cl. ......................................... 714/25; 714/718
(58) Field of Search ............................ 714/25, 29, 42, 714/54, 702, 718, 719

(56) References Cited

U.S. PATENT DOCUMENTS

| | | | | |
|---|---|---|---|---|
| 4,688,222 A | * | 8/1987 | Blum | .......................... 714/732 |
| 5,410,547 A | * | 4/1995 | Drain | .......................... 714/732 |
| 5,517,615 A | * | 5/1996 | Sefidvash et al. | ............... 714/5 |
| 5,604,754 A | * | 2/1997 | Itskin et al. | ................. 714/798 |
| 5,638,381 A | * | 6/1997 | Cho et al. | .................... 714/732 |
| 5,740,199 A | | 4/1998 | Sibigtroth | .................... 375/219 |
| 5,742,616 A | * | 4/1998 | Torreiter et al. | ............ 714/732 |
| 6,085,334 A | * | 7/2000 | Giles et al. | ..................... 714/7 |

OTHER PUBLICATIONS

Williams, "A Painless Guide to CRC Error Detection Algorithms V3.00", Rocksoft^tm Pty Ltd, 28 pgs. (1993).

Kuo, et al., "Soft–Defect Detection (SDD) Technique for a High–Reliability CMOS SRAM", IEEE Journal of Solid–State Circuits, vol. 25, No. 1, pp. 61–67 (1990).

* cited by examiner

Primary Examiner—Dieu-Minh Le
(74) Attorney, Agent, or Firm—Lee E. Chastain; Joanne G. Chiu

(57) ABSTRACT

A method and apparatus for confirming the operation of memory (212) operates during periods when the memory is not operating in a standard execution mode. This strategy allows the memory to be checked real-time without impacting normal bandwidth of an associated CPU (200). The method and apparatus guarantees deterministic testing by including circuitry and steps which force bus mastership and, therefore, memory access if the memory is busy for too long a period of time.

30 Claims, 3 Drawing Sheets

ELECTRONIC CONTROL APPARATUS WITH MEMORY VALIDATION AND METHOD

FIELD OF THE INVENTION

The present invention relates generally to electronic systems and more particularly to systems and methods relating to memory validation.

BACKGROUND OF THE INVENTION

Many electronic control systems are used in applications that require a high degree of dependability. Some of these applications are found in the automotive field where system failure could jeopardize passenger safety. While there are many implementations of such electronic systems, a certain group of implementations rely on redundancy to increase dependability. Such a redundant system might have multiple microprocessors, each having its own memory. While such systems provide increased dependability, they also have increased cost due to the extra components. As an alternative, other control systems reduce their cost by using a single memory array. Memory is typically a significant portion of the overall cost of a system. Other system components may or may not be duplicated. This second type of controller improves its dependability by performing validation routines to test at least some of its components, such as the memory. However, due to increased program size, increased feature sets, and increased memory size, the microprocessors in such systems are approaching bandwidth limitations with respect to executing real-time software validation routines. It would therefore be desirable if a system without redundant memory components could validate its memory for high dependability with reduced bandwidth requirements on the microprocessor.

Accordingly, there is a need for an improved electronic control system with memory validation and an accompanying method of operation.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
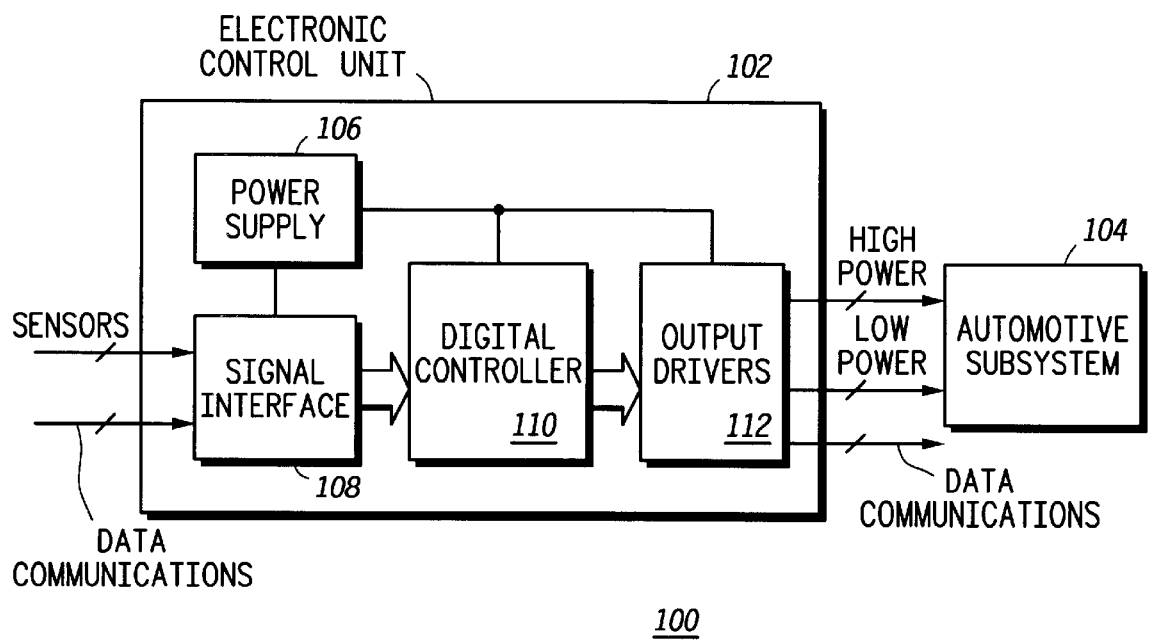
FIG. 1 depicts a block diagram of an automotive control system constructed in accordance with the present invention.

FIG. 1 depicts a block diagram of an automotive control system 100 constructed in accordance with the present invention. Automotive control system 100 contains a digital controller 110 which is able to validate the proper operation of associated memory arrays in a real-time manner without affecting the performance of the digital controller. The validation technique is largely independent of memory size and controller performance, yet is a relatively small circuit. The size of the validation circuit minimally impacts the cost of the overall system. This combination of features makes the validation technique suitable for advanced fail-safe applications. The disclosed validation technique includes a robust programmer's model that allows the validation to occur transparent to and autonomous of the normal operation of the controller. Further, specific memory ranges may be verified as required by their importance to system operation.

Continuing with FIG. 1, automotive control system 100 contains an electronic control unit (ECU) 102 coupled to an automotive subsystem 104. ECU 102 itself contains a power supply 106, a signal interface unit 108, digital controller 110 and output drivers 112. Power supply 106 provides various supply voltages necessary for the proper operation of signal interface unit 108, digital controller 110, and output drivers 112. Signal interface unit 108 receives analog and digital data from sources (not depicted) via inputs labeled SENSORS and DATA COMMUNICATIONS, respectively. Signal interface unit 108 buffers these signals and converts them to digital values, if necessary, for digital controller 110. Digital controller 110 executes various algorithms related to the control of an automobile using the outputs of signal interface unit 108 as inputs for its algorithms. Digital controller 110 is described more fully below in connection with FIG. 2. Output drivers 112 receive the control outputs from digital controller 110. Output drivers 112 buffer these signals and converts them to analog values, if necessary, for automotive subsystem 104. In the depicted embodiment, output drivers 112 output high current control signals (HIGH POWER), low current control signals (LOW POWER), and transistor-to-transistor level (TTL) or complimentary metal oxide semiconductor (CMOS) level signals (DATA COMMUNICATIONS).

In one embodiment of the described invention, automotive control system 100 is an anti-lock braking system (ABS). Automotive subsystem 104 is a hydraulic pump system associated with one or more wheels. Consequently, analog wheel speed information is input to ECU 102 from a wheel speed sensor via the SENSORS input and pump control information is output via the LOW POWER output. When digital controller 110 determines that a monitored wheel is slipping, then digital controller engages a pump to remove hydraulic brake fluid from the caliber controlling the speed of the wheel. In other applications, automotive control system 100 may control a pneumatic system (braking, suspension or other), an automotive steering system, an airbag system, a suspension system, a chassis control system, a visual display system, a powertrain control system, a navigation system, collision avoidance system, a collision warning system, etc. In theses cases, other information from the appropriate type of sensor would generate inputs to electronic control unit 102. For instance, an accelerometer, a yaw rate sensor, a steering angle sensor, a position sensor, a pressure sensor, a radar system, a global positioning satellite system, a visual sensor, a camera sensor, a human interface sensor, an environmental sensor, or a pedal travel sensor may supply inputs to electronic control unit 102. Similarly, these other applications would generate outputs for other types of automotive subsystems: actuators, motors, hydraulic assemblies. In addition, the disclosed invention may be incorporated into fields outside of the automotive industry.

Figure 2:
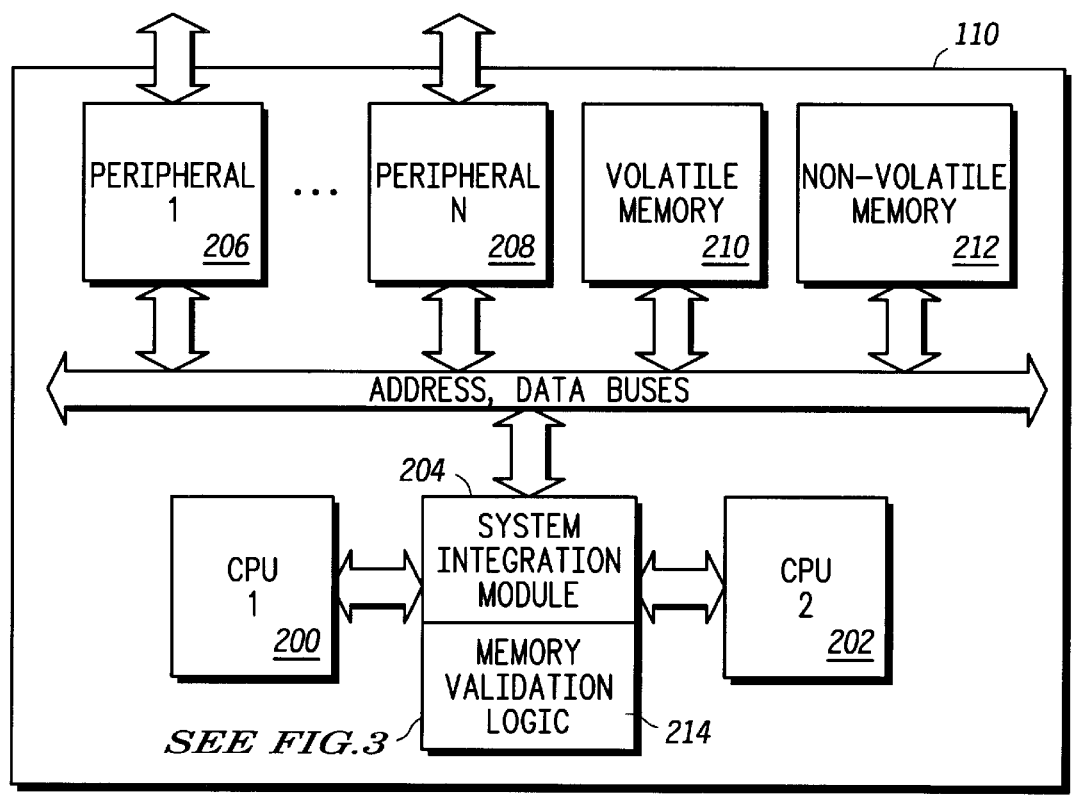
FIG. 2 depicts a block diagram of the digital controller depicted in FIG. 1.

FIG. 2 depicts a block diagram of digital controller 110 depicted in FIG. 1. Digital controller 110 contains a first central processing unit 200 (CPU 1) and a second central processing unit 202 (CPU 2) coupled to ADDRESS, DATA BUSES via a system integration module (SIM) 204.

N Peripherals 206 through 208, volatile memory 210 and non-volatile memory 212 are also connected to the ADDRESS, DATA BUSES. SIM 204 contains memory validation logic 214. The peripherals within digital controller perform various functions such as timing, serial and/or parallel communications, analog-to-digital signal conversion, digital-to-analog signal conversion, etc. Volatile memory 210 is fabricated using six-transistor (6T) static random access memory (SRAM) cells. However, other types of volatile memory may be used as appropriate. For instance, SRAM cells could be replaced with dynamic random access memory (DRAM) cells. Similarly, non-volatile memory 212 is fabricated using one-transistor (1T) flash electronically erasable programmable read only memory (Flash EEPROM) cells. Again, the EEPROM cells may be replaced with simple read only memory (ROM) cells or other types of EEPROM cells.

In operation, CPU 1 executes instructions stored in non-volatile memory 212 using inputs from the various peripherals and from both memories. CPU 1 outputs system control information via the various peripherals. These instructions and their outputs perform the ABS functions described above. SIM 204 coordinates accesses between CPU 1 and the various peripherals and memories. CPU 1 controls the various peripherals and memory validation logic 214 by writing control and data information to specific addresses assigned to control registers within the peripherals and within the memory validation logic. In parallel, CPU 2 executes the same instruction stream as does CPU 1. SIM 204 compares the output of CPU 1 and CPU 2 to determine if they diverge. If SIM 204 identifies such a divergence, then SIM 214 will assume an ABS malfunction and generate an interrupt for CPU 1. CPU 1 will alert the automotive subsystem (FIG. 1) to disregard the normal output of digital controller 110. This strategy is known as "fail-safe." In addition, CPU 1 may configure memory validation logic 214 to monitor the data stored in non-volatile memory 212. If memory validation logic 214 determines that the data within non-volatile memory 212 is corrupt, then memory validation logic will also generate an interrupt. This interrupt can also be used to alert the automotive subsystem to disregard the normal output of digital controller 110. Memory validation logic 214 is described below in connection with FIG. 3.

In the depicted embodiment, digital controller 110 includes a first CPU, a second CPU, and integrated memory. In other embodiments, digital controller 110 may include a single CPU or even more than two CPUs. Further, volatile memory 210 could be a separate integrated circuit.

Figure 3:
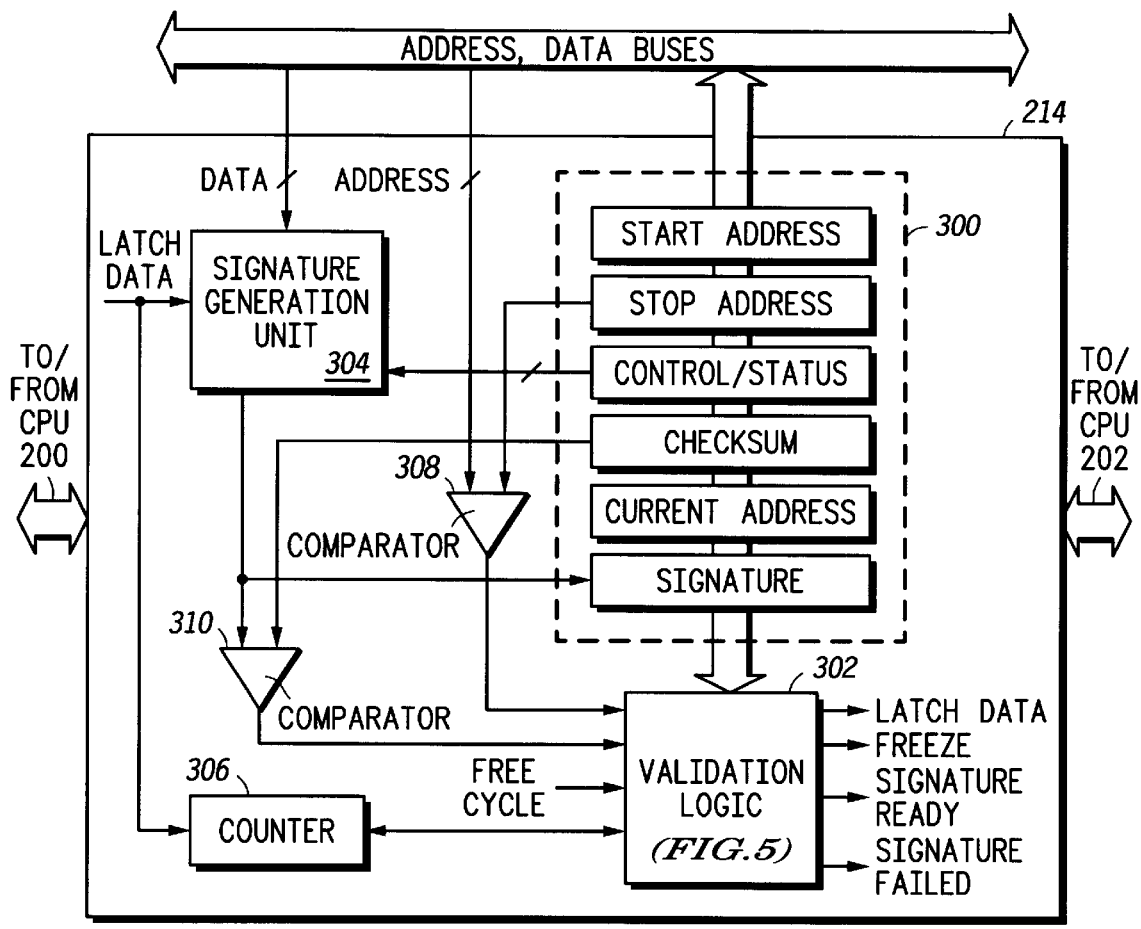
FIG. 3 depicts a block diagram of the memory validation logic depicted in FIG. 2.

FIG. 3 depicts a block diagram of memory validation logic 214 depicted in FIG. 2. Memory validation logic 214 includes a register array 300 of user programmable registers bi-directionally connected to the ADDRESS, DATA BUSES and to a validation logic 302. Validation logic 302 receives the control signal FREE CYCLE and generates the control signals LATCH DATA, FREEZE, SIGNATURE READY, and SIGNATURE FAILED. Validation logic 302 is more fully described below in connection with FIG. 5.

A signature generation unit 304 receives the data portion of ADDRESS, DATA BUSES, a control signal LATCH DATA, and the contents of a CONTROL/STATUS register in register array 300. The output of signature generation unit 304 is correlated to the data retrieved from the memory via the data portion of the ADDRESS, DATA BUSES. In the depicted embodiment, signature generation unit 304 is a linear feedback shift register (LFSR) instantiating a certain order polynomial function. One skilled in the art can select the particular polynomial order depending upon the circuit size budget and the required accuracy of the polynomial. In other embodiments, the signature generation unit could detect failures in non-volatile memory 212 using other algorithms. For instance, signature generation unit 304 could compare the parity of a datum (odd or even number of one's in the datum) with a stored parity bit. If the two parity results differed, then signature generation unit 304 would generate an error signal. This signal could be maintained as a "sticky bit." A sticky bit is a control signal that is the logical OR of a value of a function and the value of the function at a prior time. In this case, the function would be the pass/fail parity indication during the current cycle and the pass/fail parity indication of all previous memory accesses. The control bit will "stick" once a single parity error occurs. Other, more complicated techniques such as error correcting code algorithms could also be used.

A counter 306 also receives the control signal LATCH DATA and is bi-directionally coupled to validation logic 302. A first comparator 308 receives the address portion of ADDRESS, DATA BUSES and the contents of a STOP ADDRESS register in register array 300. An output of comparator 308 is input to validation logic 302. A second comparator 310 receives an output of the signature generation unit 304 and the contents of a CHECKSUM register in register array 300. An output of comparator 310 is also input to validation logic 302.

The specific operation of validation logic 302 and memory validation logic 214 is described below in connection with FIG. 5. That description is best understood in light of the following register and signal descriptions. Register array 300 includes six user programmable registers:

START ADDRESS REGISTER contains the first memory address of a block of contiguous memory address to be tested.

STOP ADDRESS REGISTER contains the last memory address of a block of contiguous memory address to be tested.

CONTROL/STATUS REGISTER contains various mode control bits and status flags. CONTROL/STATUS REGISTER is more fully described below in connection with FIG. 4.

CHECKSUM REGISTER contains the expected signature for the array under test.

CURRENT ADDRESS REGISTER contains the next memory address to be accessed in a validation operation.

SIGNATURE REGISTER contains the result of the signature generation unit after a validation operation.

Validation logic 302 receives or generate the following five control signals:

FREE CYCLE is generated by SIM 204. When asserted, FREE CYCLE indicates that CPU 1 is not using ADDRESS, DATA BUSES on the next access cycle. When de-asserted, CPU 1 will use the next bus cycle.

LATCH DATA is generated by validation logic 302. When asserted, LATCH DATA indicates that valid data is present on the data portion of ADDRESS, DATA BUSES. Signature generation unit 304 will latch this data and incorporate it into its generated signature. When de-asserted, signature generation unit 304 should ignore the data on the bus.

FREEZE is generated by validation logic 302. When asserted, SIM 204 disables the CPU 1 and CPU 2 internal clocks. CPU 1 and CPU 2 cease operations, allowing validation logic 302 to access memory in special circumstances. When de-asserted, CPU 1 and CPU 2 operate normally.

SIGNATURE READY is an interrupt generated by validation logic 302. Memory validation logic 214 asserts SIGNATURE READY to indicate the completion of a signature. When de-asserted, one of three conditions has occurred: (1) the interrupt is masked, (2) the signature is not complete, (3) the validation logic 302 is not enabled.

SIGNATURE FAILED is an interrupt generated by validation logic 302. Memory validation logic 214 asserts SIGNATURE FAILED to indicate that a completed validation operation has failed. When de-asserted, one of four conditions has occurred: (1) the interrupt is masked, (2) the operation is not complete, (3) the operation is complete but did not fail, or (4) the validation logic 302 is not enabled.

Figure 4:
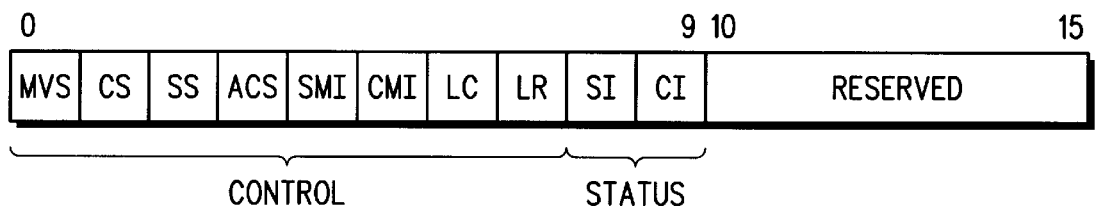
FIG. 4 depicts a programmers model of the CONTROL/STATUS register depicted in FIG. 3.

FIG. 4 depicts a programmers model of the CONTROL/STATUS register depicted in FIG. 3. The CONTROL/STATUS register contains eight single-bit control fields and two single-bit status fields:

BIT 0 Memory Validation Select (MVS) If MVS is set, then memory validation logic 214 is enabled. If MVS is cleared, then memory validation logic 214 is not enabled.

BIT 1 Cycle Steal (CS) If CS is set, then validation logic 302 may assert the control signal FREEZE, forcing a bus access in certain circumstances. If CS is cleared, then validation logic 302 may not assert the FREEZE.

BIT 2 Signature Start (SS) If SS is set, then validation logic 302 initiates a validation operation. If SS is cleared, then validation logic 302 remains idled.

BIT 3 Automatic Checksum (ACS) If ACS is set, then validation logic 302 automatically compares the output of signature generation unit 304 with the value stored in the CHECKSUM register and stores the result in the CI field. If ACS is cleared, then validation logic 302 does not store the result of the comparison into the CI field.

BIT 4 Signature Mask Interrupt (SMI) If SMI is set, then validation logic 302 masks the SIGNATURE READY interrupt. If SMI is cleared, then validation logic 302 outputs the interrupt as generated.

BIT 5 Comparison Failed Mask Interrupt (CMI) If CMI is set, then validation logic 302 masks the SIGNATURE FAILED interrupt. If CMI is cleared, then validation logic 302 outputs the interrupt as generated.

BIT 6 Loop Control (LC) If LC is set, then validation logic 302 will execute another validation operation after completing a preceding operation. If LC is cleared, then validation logic 302 will only perform a single validation operation.

BIT 7 LFSR Reset (LR) If LR is set, then the signature generation unit 304 clears its internal state to a known value. If LR is cleared, then signature generation unit 304 remains in its current state.

BIT 8 Signature Interrupt Flag (SI) Validation logic 302 sets this flag to indicate that a signature is available for comparison. CPU 1 clears this bit during its interrupt service routine.

BIT 9 Comparison Interrupt Flag (CI) Validation logic 302 sets this flag to indicate that a validation operation is complete. CPU 1 clears this bit during its interrupt service routine.

Figure 5:
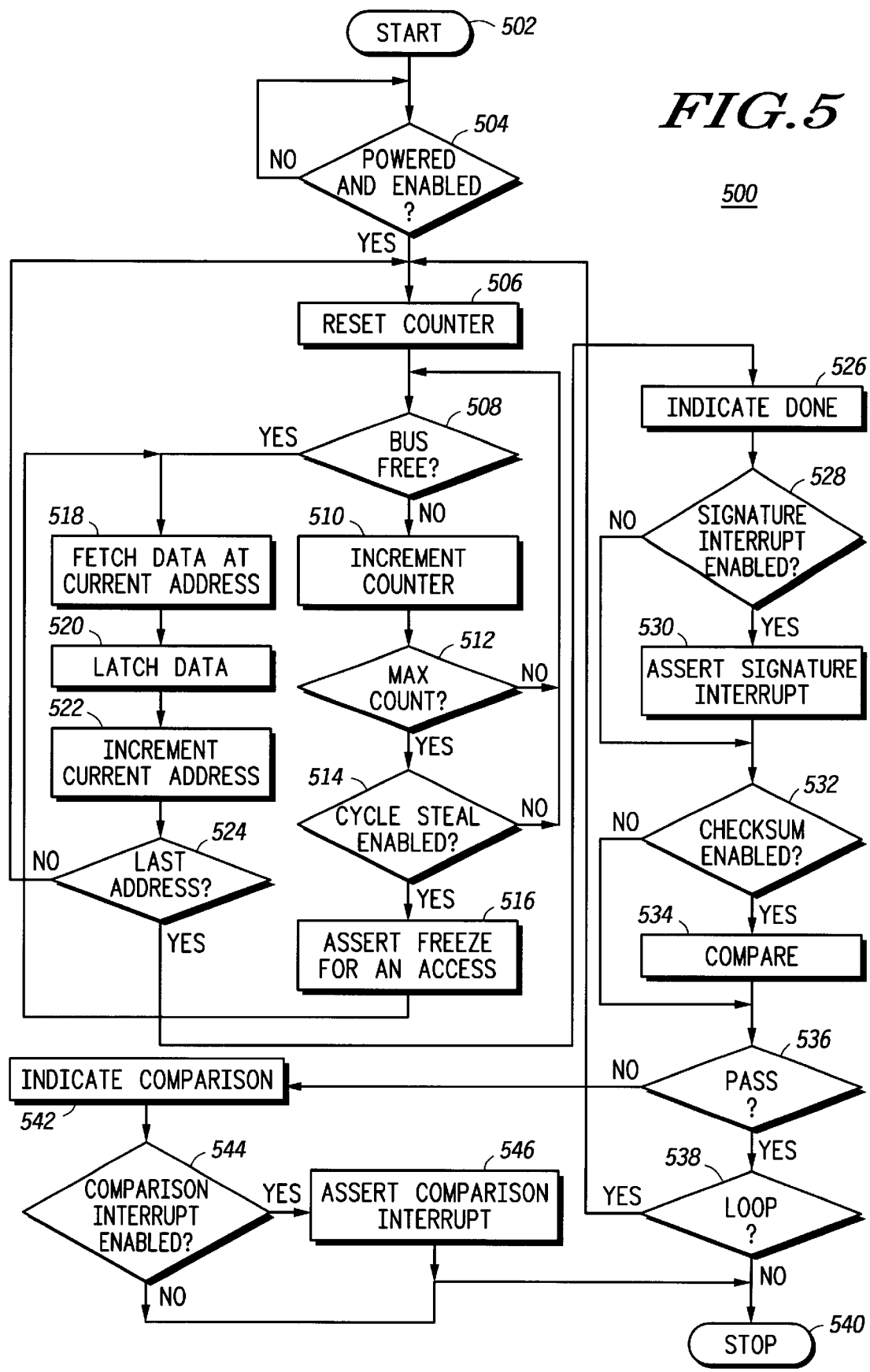
FIG. 5 depicts a flow diagram of the operation of the validation logic depicted in FIG. 3.

FIG. 5 depicts a flow diagram 500 of the operation of the validation logic 302 depicted in FIG. 3. Validation logic 302 begins at a step 502. Next, validation logic 302 waits until it is powered (MVS=1) and enabled (SS=1) to begin processing, a step 504. Once powered and enabled, validation logic 302 resets counter 306 to zero, a step 506. Validation logic 302 determines if the ADDRESS, DATA BUSES are available (FREE CYCLE=1), a step 508.

If the buses are not available to validation logic 302, then it increments counter 306, a step 510. Validation logic then determines if the value stored in counter 306 exceeds a predetermined threshold, a step 512. If the threshold is not exceeded, then flow chart 500 continues processing at step 508. If the threshold is exceeded, then validation logic 302 determines if cycle stealing is enabled (CS=1), a step 514. If cycle stealing is not enabled, then flow chart also continues processing at step 508. However, if cycle stealing is enabled, then validation logic 302 will assert FREEZE for a single memory access a step 516. As described above, this strategy ensures that a memory validation operation will occur within a predetermined period time.

Continuing with step 508, if the buses are available or after the completion of step 516, validation logic 302 fetches data stored at the address indicated by the contents of the CURRENT ADDRESS REGISTER, a step 518. Validation logic 302 latches the data into signature generation unit 304 by asserting the control signal LATCH DATA, a step 520. Next, validation logic 302 increments the value stored in the CURRENT ADDRESS register in preparation for the next memory access, a step 522. Validation logic 302 determines if it has completed inspecting the entire range of memory addresses (STOP ADDRESS=ADDRESS BUS value), a step 524. If validation logic 302 has not inspected the entire memory range, then it continues processing at step 506. If validation logic 302 has inspected the entire memory range, then it continues processing at step 526.

In step 526, validation logic 302 indicates the inspection of all memory addresses and the generation of a signature by setting the SI status field. Next, validation logic 302 determines if signature interrupts are allowed (SMI=0), a step 528. If signature interrupts are allowed, then validation logic 302 asserts the control signal SIGNATURE READY, a step 530. If signatures are not allowed or after step 530, validation logic 302 determines if it is to compare the signature output by signature generation unit 304 with the contents of CHECKSUM register (ACS=1), a step 532. If validation logic 302 is to compare the two values, then validation logic performs the comparison and writes the result to the CI status field, a step 534. If the comparison is not enabled or after step 534, validation logic 302 determines if the validation operation is successful (two values match), a step 536. If the operation was successful, then validation logic 302 determines if the loop mode is enabled (LC=1) a step 538. If the loop mode is enabled, then validation logic 302 continues processing at step 506. If the loop mode is not enabled, the operation of validation logic 302 is complete, a step 540.

Returning to step 536, if the validation operation was not successful, then validation logic 302 indicates the failed comparison by setting the CI status field, a step 542. Next, validation logic 302 determines if comparison interrupts are allowed (CMI=0), a step 544. If comparison interrupts are allowed, then validation logic 302 asserts the control signal SIGNATURE FAILED, a step 546. If comparison interrupts are not allowed or after the step 546, then the operation of validation logic 302 is complete (step 540).

Although the present invention has been described with reference to a specific embodiment, further modifications and improvements will occur to those skilled in the art. For instance, the memory validation logic, the CPU 1, and the memory may be located anywhere within digital controller 110, as integrated circuits or as separate circuits. Also, the memory under test could be volatile memory. In this case, validation logic 302, would first write information to a particular memory location before reading it for evaluation. If the volatile memory already contained unknown information, then that information would be saved in a free area of memory prior to test and would be returned to the original memory location after test. It is to be understood therefore, that the invention encompasses all such modifications that do not depart from the spirit and scope of the invention as defined in the appended claims.

What is claimed is:

1. A memory validation system comprising:

signature generation logic responsive to data retrievable from a bus coupled to a memory during a second access period when the bus is free, where the bus is controllable by a device operating in a standard execution mode during a first access period, the first access period occurring before the second access period, the signature generation logic having an output that produces a first data item that correlates to the data retrieved from the bus; and a comparator responsive to the output of the signature generation logic to compare the first data item to a predetermined second data item.

2. The memory validation system of claim 1, wherein the device accesses the bus during a third access period, the third access period occurring after the second access period.

3. The memory validation system of claim 2, wherein a third data item is retrieved by the signature generation logic during a fourth access period when the bus is free.

4. The memory validation system of claim 1, further comprising validation logic responsive to the comparator.

5. The memory validation system of claim 4, further comprising a plurality of registers, the validation logic asserting an interrupt in response to a result from the comparator and in response to at least one of the plurality of registers.

6. The memory validation system of claim 4, further comprising a plurality of registers, the validation logic setting a status flag in response to a result from the comparator and in response to at least one of the plurality of registers.

7. The memory validation system of claim 4, further comprising a plurality of registers, the plurality of registers including at least one of a start register, a stop register, a control and status register, a checksum register, a current address register, and a signature register.

8. The memory validation system of claim 4, further comprising a counter coupled to the validation logic.

9. The memory validation system of claim 8, wherein when the counter reaches a predetermined value, the validation logic asserts a freeze signal to temporarily halt operation of the device.

10. The memory validation system of claim 9, wherein the signature generation logic receives a third data item from the bus while the freeze signal is asserted.

11. An apparatus comprising:

a memory;

a bus coupled to the memory;

a device coupled to the bus to control the bus during a first time period;

a memory validation system including:

signature generation logic responsive to data retrievable from the bus during a second time period when the bus is free from control of the device, the signature generation logic having an output to produce a first data item; and a comparator responsive to the output of the signature generation logic to compare the first data item to a predetermined second data item.

12. The apparatus of claim 11, wherein the device includes a first processor and a second processor.

13. The apparatus of claim 11, wherein the memory is non-volatile memory and the first data item is representative of the data from the bus.

14. The apparatus of claim 11, further comprising an integration module coupled to the bus, wherein the memory validation system is disposed within the integration module.

15. The apparatus of claim 11, further comprising a peripheral device coupled to the bus.

16. An electronic control apparatus comprising:

an input interface to receive signals from at least one sensor;

a digital controller responsive to the input interface, the digital controller including:

a memory;

a bus coupled to the memory;

a device coupled to the bus to control the bus during a first time period;

a memory validation system including:

signature generation logic responsive to data retrievable from the bus during a second time period when the bus is free from control of the device, the signature generation logic having an output to produce a first data item; and a comparator responsive to the output of the signature generation logic to compare the first data item to a predetermined second data item; and an output interface responsive to the digital controller.

17. The electronic control apparatus of claim 16, wherein the output interface produces an output signal that drives an element selected from the group consisting of an actuator, a motor, a solenoid, and a hydraulic assembly, within an automotive system and the first data item correlates to the data from the bus.

18. The electronic control apparatus of claim 16, further comprising an automotive system selected from the group consisting of a braking system, a pneumatic system, an airbag system, a visual display, a steering system, a suspension system, a chassis control system, a powertrain control system, a navigation system, a collision avoidance system, a collision warning system, and an adaptive cruise control system.

19. The electronic control apparatus of claim 16, wherein the sensor is selected from the group consisting of a wheel speed sensor, accelerometer, a yaw rate sensor, a steering angle sensor, a position sensor, a pressure sensor, a radar system, a global positioning system sensor, a visual sensor, a camera system, human interface sensor, environmental sensor, and a pedal travel sensor.

20. A method of processing data to validate memory content, the method comprising:

determining whether a bus coupled to a memory is available for access;

fetching data from the bus when the bus is available for access;

performing signature generation on the data to produce a first data item; and comparing the first data item with a second data item.

21. The method of claim 20, further comprising reinitializing a counting device after determining that the bus is available for access.

22. The method of claim 20, further comprising comparing a value of the counting device to a predetermined value.

23. The method of claim 22, further comprising fetching data from the bus and performing signature generation on the data to produce the first data item after comparing the value of the counting device to the predetermined value.

24. The method of claim 22, further comprising asserting a freeze signal after comparing the value of the counting device to the predetermined value.

25. The method of claim 24, wherein the value exceeds the predetermined value.

26. The method of claim 20, wherein a device accesses the bus during a standard execution mode of operation.

27. The method of claim 20, wherein signature generation is performed after a plurality of data words are retrieved from the bus.

28. The method of claim 27, wherein signature generation is performed a plurality of different times.

29. The method of claim 20, further comprising asserting an interrupt signal after comparing the first data item with the second data item.

30. The method of claim 20, further comprising retrieving a control bit selected from the group consisting of a memory validate select bit, a cycle steal bit, a signature start bit, an automatic checksum bit, a signature mask interrupt, a comparison failed mask interrupt bit, a loop control bit, a signature interrupt flag bit, a comparison interrupt flag bit, and a signature generation logic reset bit.

* * * * *